United States Patent
Liu

(10) Patent No.: US 12,394,458 B2
(45) Date of Patent: Aug. 19, 2025

(54) MEMORY CLOCK CONTROL CIRCUIT AND METHOD FOR CONTROLLING MEMORY CLOCK

(71) Applicant: REALTEK SEMICONDUCTOR CORP., Hsinchu (TW)

(72) Inventor: Wei-Chen Liu, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 163 days.

(21) Appl. No.: 18/382,565

(22) Filed: Oct. 23, 2023

(65) Prior Publication Data
US 2024/0420749 A1    Dec. 19, 2024

(30) Foreign Application Priority Data
Jun. 17, 2023  (TW) .................................. 112122782

(51) Int. Cl.
*G11C 7/22*   (2006.01)
*G11C 7/10*   (2006.01)

(52) U.S. Cl.
CPC ............ *G11C 7/222* (2013.01); *G11C 7/1063* (2013.01)

(58) Field of Classification Search
CPC .................................. G11C 7/222; G11C 7/22
USPC ..................................................... 365/233.1
See application file for complete search history.

(56) References Cited

U.S. PATENT DOCUMENTS

| 8,847,649 | B2 | 9/2014 | Wu |
| 9,658,634 | B2 | 5/2017 | Tripathi et al. |
| 2004/0103328 | A1* | 5/2004 | Ichien .................... G06F 1/3228 713/300 |
| 2005/0237825 | A1* | 10/2005 | Kawajiri ................ G11C 5/145 365/189.11 |
| 2020/0005728 | A1* | 1/2020 | Kurd ........................ G06F 1/26 |

FOREIGN PATENT DOCUMENTS

| TW | 201015282 A | 4/2010 |
| TW | 201706748 A | 2/2017 |

* cited by examiner

*Primary Examiner* — Muna A Techane
(74) *Attorney, Agent, or Firm* — Li & Cai Intellectual Property (USA) Office

(57) ABSTRACT

A memory clock control circuit includes a voltage detection circuit and a first logic circuit. The voltage detection circuit receives a supply voltage of at least one memory, and outputs a control signal according to a comparison result of the supply voltage and at least one threshold value. The threshold value includes a first threshold value that is greater than a system reset voltage and less than a minimum operating voltage of the memory. The first logic circuit receives the control signal and a first clock signal of at least one memory controller, and outputs a first memory clock signal to the memory according to the control signal. According to the control signal, the first logic circuit outputs a clock stop signal to the memory when the supply voltage is less than the first threshold value. A method for controlling a memory clock is also provided.

14 Claims, 6 Drawing Sheets

MEMORY CLOCK CONTROL CIRCUIT AND METHOD FOR CONTROLLING MEMORY CLOCK

CROSS-REFERENCE TO RELATED PATENT APPLICATION

This application claims the benefit of priority to Taiwan Patent Application No. 112122782, filed on Jun. 17, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to controlling a memory clock, and more particularly to a memory clock control circuit and a method for controlling a memory clock, in which a memory clock signal of a logic low level is output to stop operation of a memory when a supply voltage of the memory is less than a minimum operating voltage of the memory but greater than a system reset voltage of a system.

BACKGROUND OF THE DISCLOSURE

Conventionally, in a system that includes a processor, a memory controller, and a memory, a brown-out reset (BOR) circuit is often adopted for resetting the system when a system voltage is less than a system reset voltage of the system. If the system reset voltage is set too high, the system may be frequently reset due to a ripple voltage. However, if the system reset voltage is set too low, a blind zone of the operating memory will become wider.

The so-called blind zone refers to a voltage range in which a supply voltage of the memory is less than a minimum operating voltage of the memory but greater than the system reset voltage of the system. In this blind zone, the memory can still execute read/write commands. That is, the system does not stop operation of the memory. However, the supply voltage at this time is too low, and the memory may misidentify the read/write commands. Furthermore, the supply voltage of the memory is related to the system voltage. Since the system voltage at this time is also too low and does not yet reach a system reset standard, the processor is likely to malfunction and send unexpected commands to the memory. The above-mentioned situations may cause irreversible consequences to the memory.

SUMMARY OF THE DISCLOSURE

In response to the above-referenced technical inadequacies, the present disclosure provides a memory clock control circuit and a method for controlling a memory clock, in which a memory clock signal of a logic low level is output to stop operation of a memory when a supply voltage of the memory is less than a minimum operating voltage of the memory but greater than a system reset voltage of a system.

In order to solve the above-mentioned problems, one of the technical aspects adopted by the present disclosure is to provide a memory clock control circuit, which is coupled between at least one memory controller and at least one memory. The memory clock control circuit includes a voltage detection circuit and a first logic circuit. The voltage detection circuit receives a supply voltage of the at least one memory, and outputs a control signal according to a comparison result of the supply voltage and at least one threshold value. The at least one threshold value includes a first threshold value, and the first threshold value is greater than a system reset voltage and less than a minimum operating voltage of the at least one memory. The first logic circuit is coupled to the voltage detection circuit, the at least one memory controller, and the at least one memory. The first logic circuit receives the control signal and a first clock signal provided by the at least one memory controller, and outputs a first memory clock signal to the at least one memory according to the control signal. According to the control signal, the first logic circuit outputs a clock stop signal to the at least one memory when the supply voltage is less than the first threshold value.

In order to solve the above-mentioned problems, another one of the technical aspects adopted by the present disclosure is to provide a method for controlling a memory clock. The method is applied to a system that includes at least one memory controller and at least one memory. The method includes the following steps: configuring a voltage detection circuit to receive a supply voltage of the at least one memory, and to output a control signal according to a comparison result of the supply voltage and at least one threshold value; and configuring a first logic circuit to receive the control signal and a first clock signal provided by the at least one memory controller, and to output a first memory clock signal to the at least one memory according to the control signal. The at least one threshold value includes a first threshold value, and the first threshold value is greater than a system reset voltage and less than a minimum operating voltage of the at least one memory. According to the control signal, the first logic circuit outputs a clock stop signal to the at least one memory when the supply voltage is less than the first threshold value.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
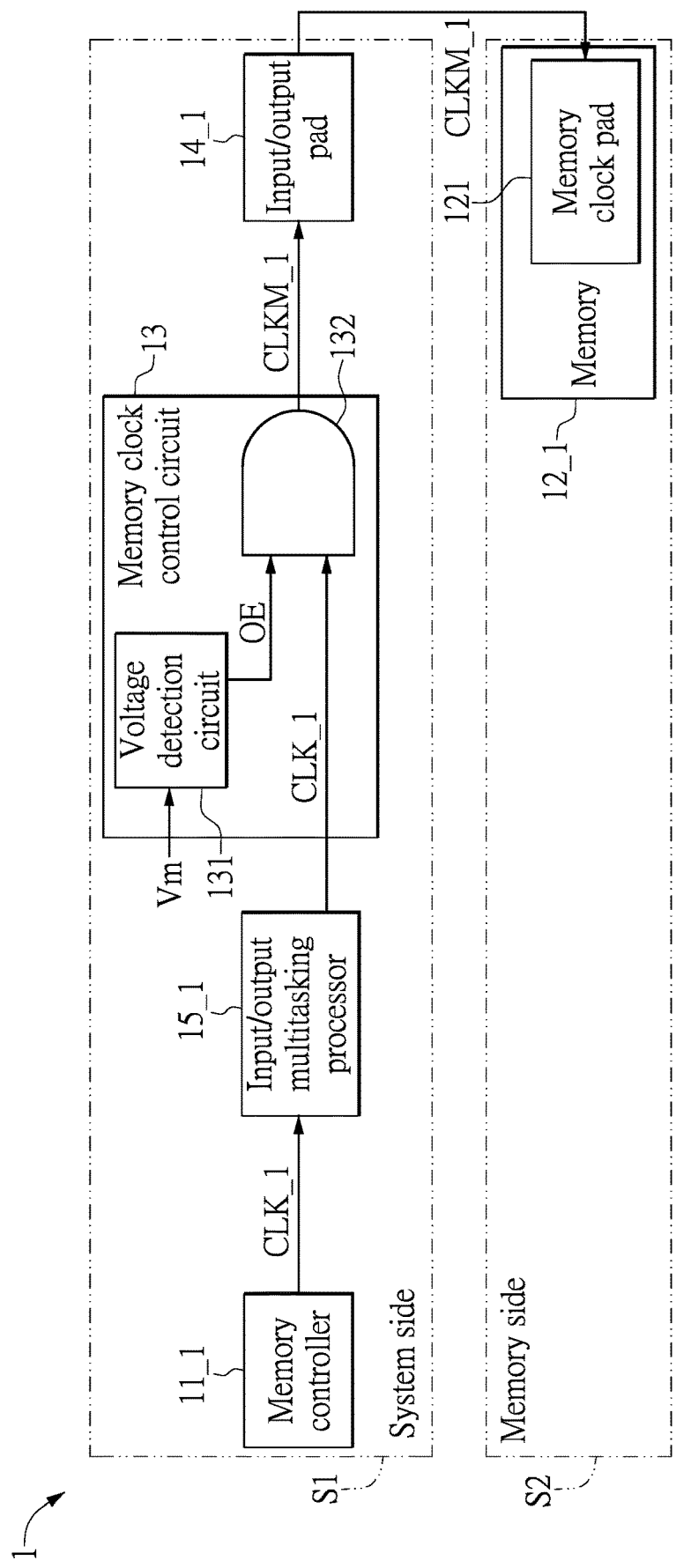
FIG. 1 is a functional block diagram of a memory clock control circuit according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Figure 2:
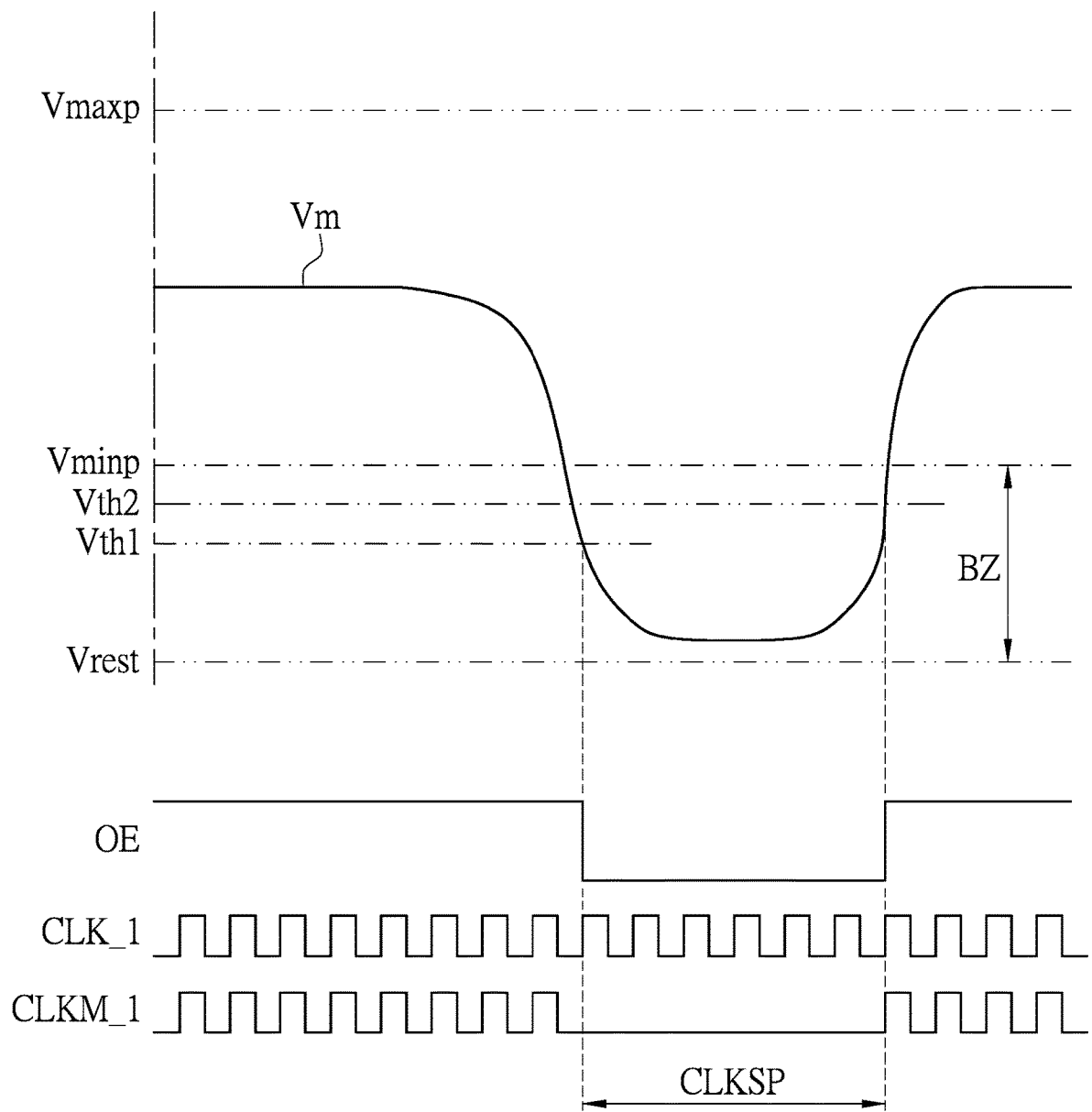
FIG. 2 is a timing diagram of a supply voltage and a first memory clock signal according to one embodiment of the present disclosure.

Reference is made to FIG. 1 and FIG. 2, in which FIG. 1 is a functional block diagram of a memory clock control circuit according to a first embodiment of the present disclosure, and FIG. 2 is a timing diagram of a supply voltage and a first memory clock signal according to one embodiment of the present disclosure. As shown in FIG. 1 and FIG. 2, the present disclosure provides a memory clock control circuit 13, which is applied to a system 1 that includes at least one memory controller and at least one memory. Specifically, the memory clock control circuit 13 is coupled between the at least one memory controller and the at least one memory, and includes a voltage detection circuit 131 and a first logic circuit 132.

For ease of illustration, in the first embodiment of the present disclosure, the memory clock control circuit 13 is exemplified as being coupled between a memory controller 11_1 and a memory 12_1. Under this circumstance, the voltage detection circuit 131 receives a supply voltage Vm of the memory 12_1, and outputs a control signal OE according to a comparison result of the supply voltage Vm and at least one threshold value. It should be noted that the at least one threshold value includes a first threshold value Vth1, and the first threshold value Vth1 is greater than a system reset voltage Vrest and less than a minimum operating voltage Vminp of the memory 12_1.

For example, when the system reset voltage Vrest of the system 1 is 2.2 V, and the minimum operating voltage Vminp of the memory 12_1 is 2.7 V, the voltage detection circuit 131 is configured to set the first threshold value Vth1 as 2.5 V through a register (not shown in FIG. 1). However, the present disclosure is not limited thereto. In fact, the voltage detection circuit 131 can determine the first threshold value Vth1 according to actual implementation and regulations of the system 1 and the memory 12_1. Furthermore, the memory 12_1 can be a non-volatile memory that does not lose stored information even if power is turned off, such as a flash memory or a read-only memory. However, the present disclosure is not limited thereto.

The first logic circuit 132 is coupled to the voltage detection circuit 131, the memory controller 11_1, and the memory 12_1. Under this circumstance, the first logic circuit 132 receives the control signal OE and a first clock signal CLK_1 provided by the memory controller 11_1, and outputs a first memory clock signal CLKM_1 to the memory 12_1 according to the control signal OE. It should be noted that, according to the control signal OE, the first logic circuit 132 outputs a clock stop signal CLKSP to the memory 12_1 when the supply voltage Vm is less than the first threshold value Vth1.

The first logic circuit 132 can be an AND gate, and two input ends of the first logic circuit 132 respectively receive the control signal OE and the first clock signal CLK_1. Hence, in response to the control signal OE being at a logic high level, the first logic circuit 132 outputs the first memory clock signal CLKM_1 of the first clock signal CLK_1. In response to the control signal OE being at a logic low level, the first logic circuit 132 outputs the first memory clock signal CLKM_1 of the logic low level as the clock stop signal CLKSP.

In other words, the first logic circuit 132 can determine whether or not to transmit the first clock signal CLK_1 to the memory 12_1 according to the control signal OE. Since the memory 12_1 relies on the first clock signal CLK_1 provided by the memory controller 11_1 for identifying read/write commands and received information, the memory clock control circuit 13 can stop operation of the memory 12_1 by the first logic circuit 132 not transmitting the first clock signal CLK_1.

As shown in FIG. 2, when the supply voltage Vm of the memory 12_1 ranges between a maximum operating voltage Vmaxp and the minimum operating voltage Vminp of the memory 12_1, the voltage detection circuit 131 outputs the control signal OE of the logic high level. According to the control signal OE, the first logic circuit 132 can output the first memory clock signal CLKM_1 of the first clock signal CLK_1 (i.e., transmitting the first clock signal CLK_1) to maintain operation of the memory 12_1. However, when the supply voltage Vm is less than the first threshold value Vth1, the voltage detection circuit 131 outputs the control signal OE of the logic low level. According to the control signal OE, the first logic circuit 132 can output the first memory clock signal CLKM_1 of the logic low level (i.e., not transmitting the first clock signal CLK_1) to stop operation of the memory 12_1.

Therefore, when the supply voltage Vm is less than the first threshold value Vth1, the voltage detection circuit 131 outputs the control signal OE of the logic low level. It should be noted that the first threshold value Vth1 is greater than the system reset voltage Vrest of the system 1 and less than the minimum operating voltage Vminp of the memory 12_1. That is, in the present disclosure, another threshold value can be set with respect to the supply voltage Vm of the memory 12_1 in a blind zone BZ for identifying a condition to stop operation of the memory 12_1. As such, compared with a conventional brown-out reset circuit that resets the system 1, the memory clock control circuit 13 can stop operation of the memory 12_1 at an earlier time. In addition, the memory clock control circuit 13 can stop operation of the memory 12_1 in the blind zone BZ, such that incidences of the memory 12_1 executing unexpected read/write commands in the blind zone BZ are significantly decreased.

In order to prevent frequent stopping and restarting of operation of the memory 12_1 caused by unstable fluctuation of the supply voltage Vm, the at least one threshold value can further include a second threshold value Vth2. The second threshold value Vth2 is greater than the first threshold value Vth1 and less than the minimum operating voltage Vminp of the memory 12_1. After outputting the control signal OE of the logic low level, the voltage detection circuit 131 outputs the control signal OE of the logic high level when the supply voltage Vm is greater than the second threshold value Vth2. As such, the first logic circuit 132 can output the first memory clock signal CLKM_1 of the first clock signal CLK_1 according to the control signal OE, so as to restart operation of the memory 12_1.

For example, when the first threshold value Vth1 is 2.5 V, and the minimum operating voltage Vminp of the memory 12_1 is 2.7 V, the voltage detection circuit 131 is further configured to set the second threshold value Vth2 as 2.6 V through the register. However, the present disclosure is not limited thereto. Accordingly, the memory clock control circuit 13 can not only stop operation of the memory 12_1 in the blind zone BZ, but also restart operation of the memory 12_1 in the blind zone BZ.

Furthermore, the memory controller 11_1 and a processor (not shown in FIG. 1) of the system 1 can be integrated on a system-on-chip, and the memory 12_1 can be integrated with other memories on a memory chip. The system-on-chip and the memory chip can be two independent packages, and are electrically connected with each other via wires. However, the present disclosure is not limited thereto. In the present embodiment, the system 1 is further divided into a system side S1 and a memory S2 (as shown in FIG. 1).

When the memory controller 11_1 on the system side S1 is coupled to the memory 12_1 on the memory side S2 through an input/output pad 14_1, the memory clock control circuit 13 can be disposed between the input/output pad 14_1 and the memory controller 11_1 on the system side S1, and be integrated on the system-on-chip. Specifically, the first logic circuit 132 of the memory clock control circuit 13 is coupled to the memory 12_1 on the memory side S2 through the input/output pad 14_1 on the system side S1, and outputs the first memory clock signal CLKM_1 to a memory clock pad 121 of the memory 12_1 through the input/output pad 14_1.

Moreover, when being coupled between the memory controller 11_1 and the memory 12_1, the memory clock control circuit 13 can also be disposed between an input/output multitasking processor 15_1 and the input/output pad 14_1 on the system side S1. The memory controller 11_1 on the system side S1 can provide the first clock signal CLK_1 to the first logic circuit 132 through the input/output multitasking processor 15_1, but the present disclosure is not limited thereto. An input/output multitasking processor can include a multiplexer. Generally, an output pin of the input/output multitasking processor can be configured to serve different functions, and can be used for a general-purpose input/output (GPIO), a serial peripheral interface (SPI), inter-IC sound (I2S), etc. In the present embodiment, through the register, the output pin of the input/output multitasking processor that is coupled to an input/output pad is used for memory clock output.

Figure 3:
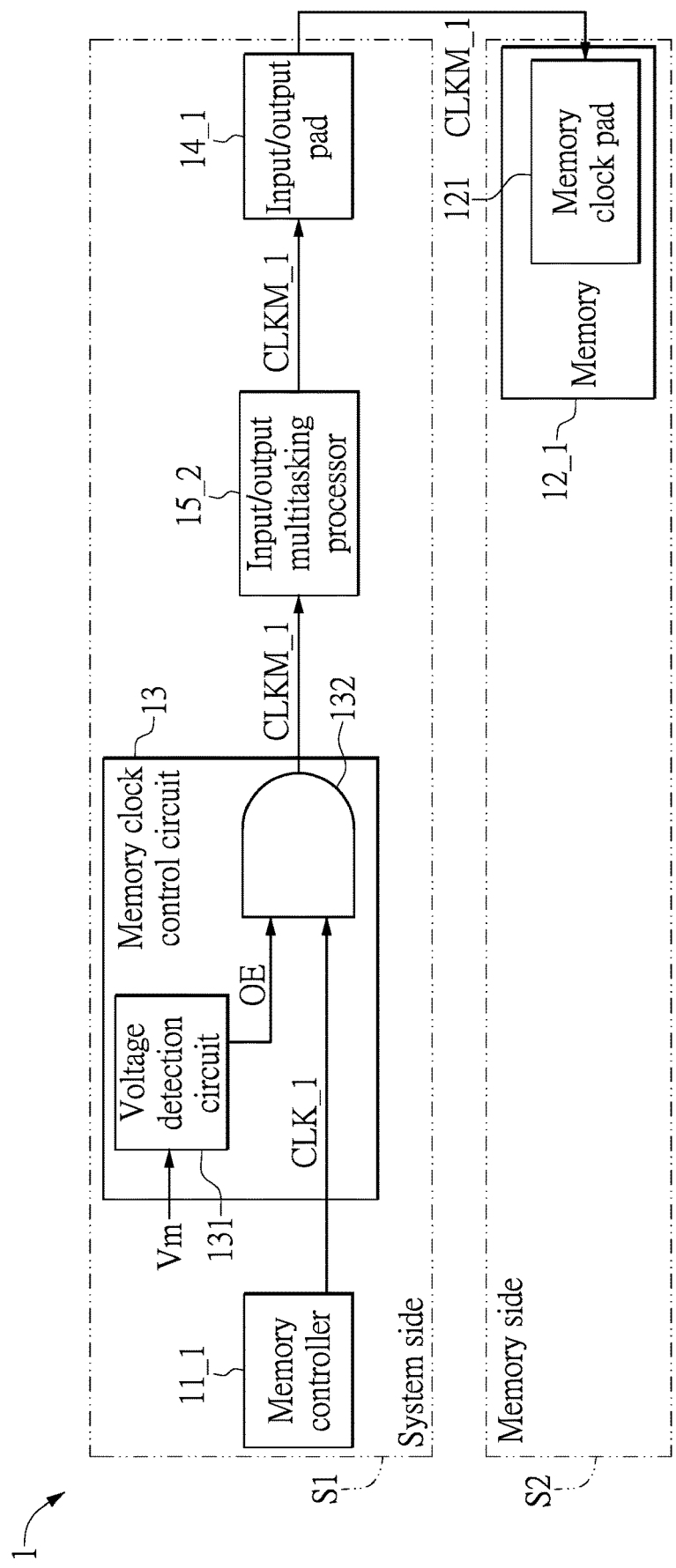
FIG. 3 is a functional block diagram of the memory clock control circuit according to a second embodiment of the present disclosure.

Reference is made to FIG. 3, which is a functional block diagram of the memory clock control circuit according to a second embodiment of the present disclosure. The memory clock control circuit 13 of the second embodiment is similar to that of the first embodiment, and the similarities therebetween will not be reiterated herein. It should be noted that, while the memory clock control circuit 13 of the first embodiment is disposed between the input/output multitasking processor 15_1 and the input/output pad 14_1 on the system side S1, the memory clock control circuit 13 of the second embodiment is disposed between the memory controller 11_1 and an input/output multitasking processor 15_2 on the system side S1. Furthermore, the first logic circuit 132 of the second embodiment outputs the first memory clock signal CLKM_1 to the input/output pad 14_1 through the input/output multitasking processor 15_2.

Figure 4:
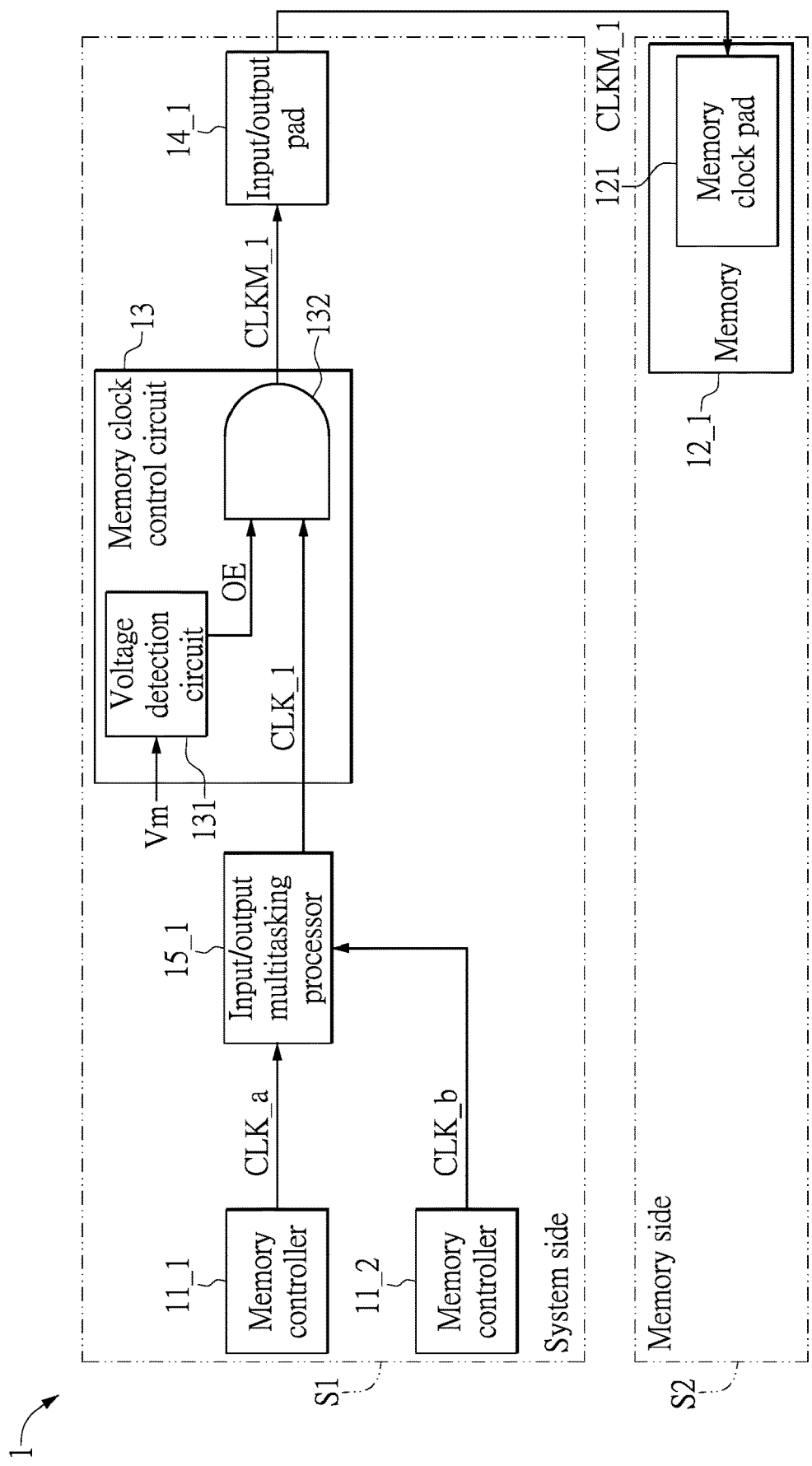
FIG. 4 is a functional block diagram of the memory clock control circuit according to a third embodiment of the present disclosure.

Reference is made to FIG. 4, which is a functional block diagram of the memory clock control circuit according to a third embodiment of the present disclosure. The memory clock control circuit 13 of the third embodiment is also similar to that of the first embodiment, and the similarities therebetween will not be reiterated herein. It should be noted that, while the memory clock control circuit 13 of the first embodiment is coupled between the memory controller 11_1 and the memory 12_1, the memory clock control circuit 13 of the third embodiment is coupled between two memory controllers 11_1, 11_2 and the memory 12_1.

The memory controllers 11_1, 11_2 can each be, for example, a NOR flash memory controller or a NAND flash memory controller, but the present disclosure is not limited thereto. A clock signal output by only one memory controller is provided to the memory 12_1 each time. Accordingly, the first logic circuit 132 of the third embodiment can receive the first clock signal CLK_1 provided by the memory controllers 11_1, 11_2 through the input/output multitasking processor 15_1. Specifically, the input/output multitasking processor 15_1 can receive a clock signal CLK_a output by the memory controller 11_1 and a clock signal CLK_b output by the memory controller 11_2, and choose one of the clock signal CLK_a and the clock signal CLK_b as the first clock signal CLK_1. Then, said first clock signal CLK_1 is provided to the first logic circuit 132.

Figure 5:
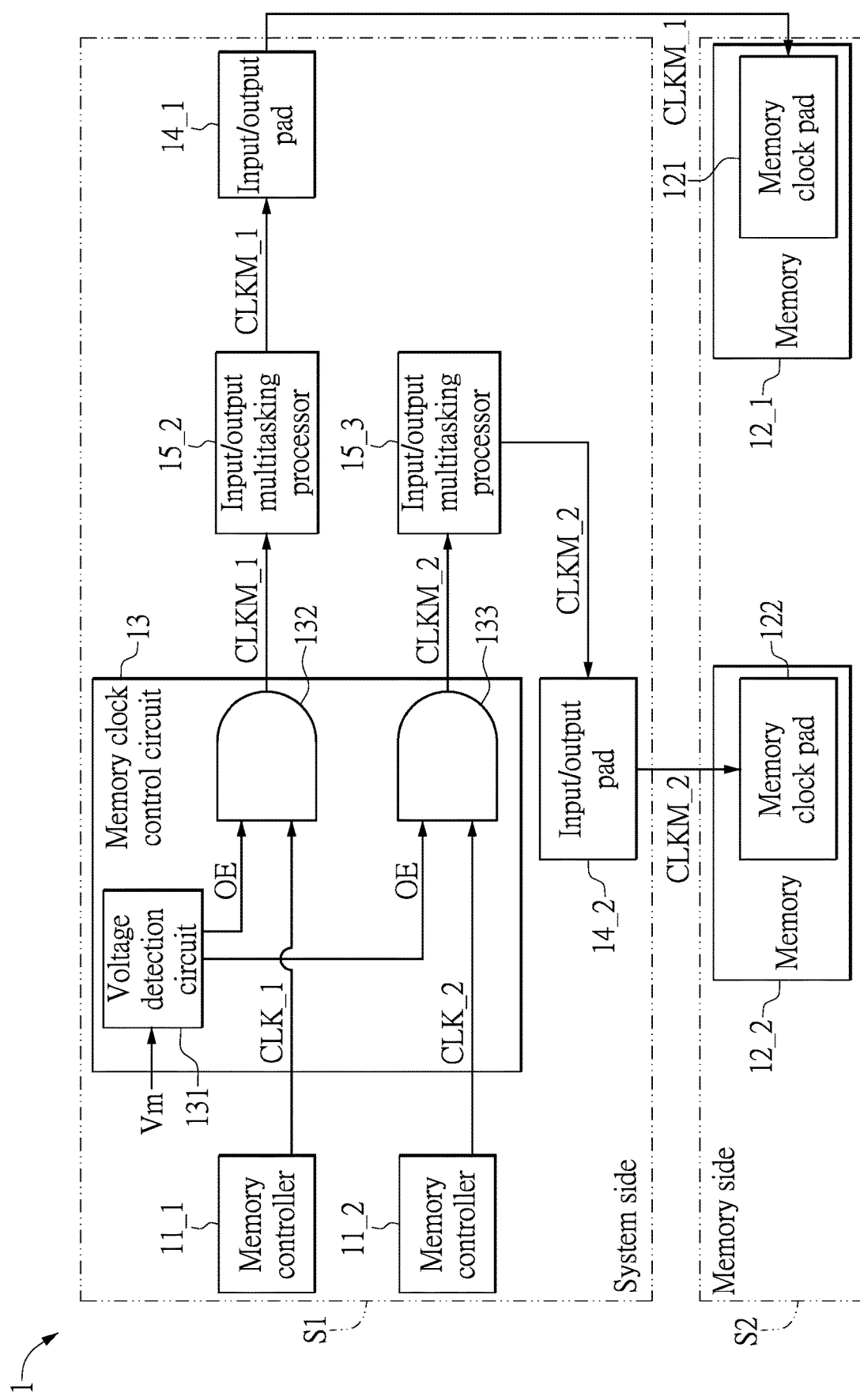
FIG. 5 is a functional block diagram of the memory clock control circuit according to a fourth embodiment of the present disclosure.

Reference is made to FIG. 5, which is a functional block diagram of the memory clock control circuit according to a fourth embodiment of the present disclosure. The memory clock control circuit 13 of the fourth embodiment is similar to that of the second embodiment, and the similarities therebetween will not be reiterated herein. It should be noted that the memory clock control circuit 13 of the fourth embodiment is coupled between the two memory controllers 11_1, 11_2 and two memories 12_1, 12_2. Different from the memory controllers 11_1, 11_2 of the third embodiment, the memory controllers 11_1, 11_2 of the fourth embodiment correspond to the memories 12_1, 12_2, respectively. Accordingly, the first logic circuit 132 of the fourth embodiment is coupled to the memory controller 11_1 and receives the first clock signal CLK_1 provided by the memory controller 11_1, and is coupled to the memory 12_1 and outputs the first memory clock signal CLKM_1 to the memory 12_1.

The memory clock control circuit 13 of the fourth embodiment further includes a second logic circuit 133 coupled to the voltage detection circuit 131, the memory controller 11_2, and the memory 12_2. The second logic circuit 133 receives the control signal OE and a second clock signal CLK_2 provided by the memory controller 11_2, and outputs a second memory clock signal CLKM_2 of the second clock signal CLK_2 or of the logic low level to the memory 12_2 according to the control signal OE. Specifically, the second logic circuit 133 can output the second memory clock signal CLKM_2 to an input/output pad 14_2 through an input/output multitasking processor 15_3, and output the second memory clock signal CLKM_2 to a memory clock pad 122 of the memory 12_2 through the input/output pad 14_2. Detailed descriptions of the second logic circuit 133 outputting the second memory clock signal CLKM_2 are similar to those of the first logic circuit 132 outputting the first memory clock signal CLKM_1, and thus will not be reiterated herein.

Figure 6:
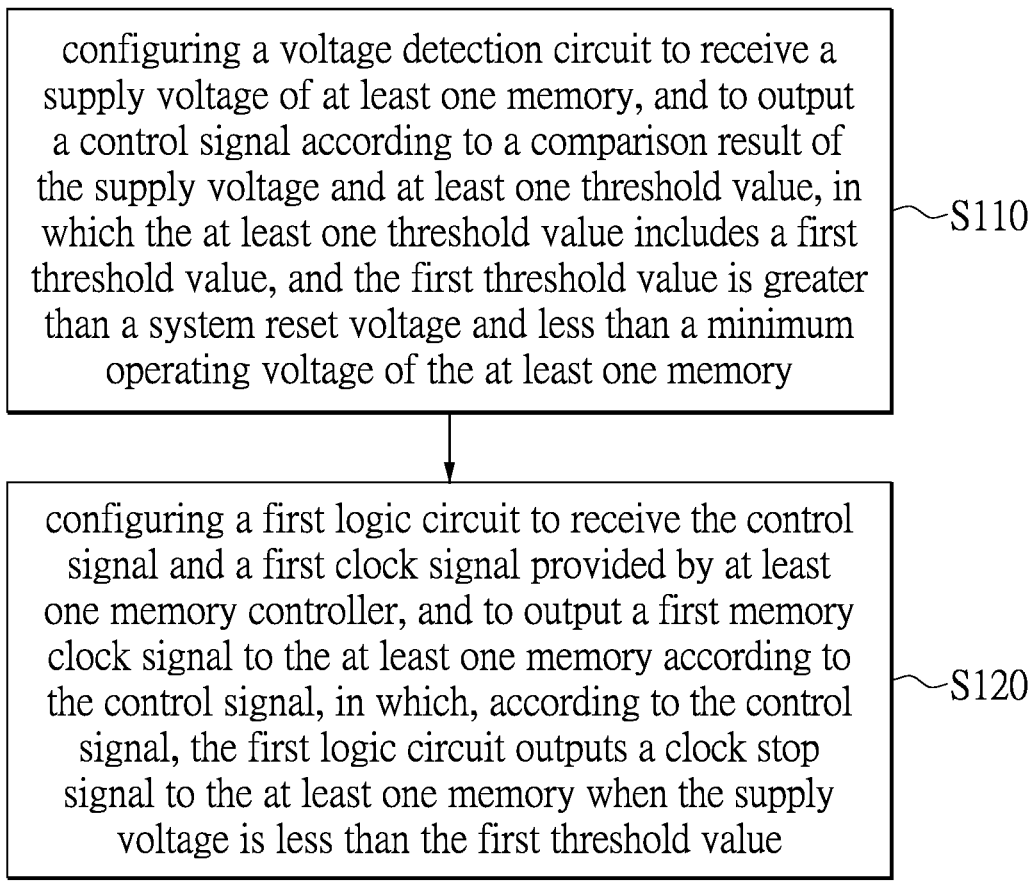
FIG. 6 is a flowchart of a method for controlling a memory clock according to one embodiment of the present disclosure.

Finally, reference is made to FIG. 6, which is a flowchart of a method for controlling a memory clock according to one embodiment of the present disclosure. The method of the present disclosure is applied to the system 1 that includes the at least one memory controller and the at least one memory. The method includes the following steps.

Step S110: configuring a voltage detection circuit to receive the supply voltage of the at least one memory, and to output a control signal according to a comparison result of the supply voltage and the at least one threshold value, in which the at least one threshold value includes a first threshold value, and the first threshold value is greater than a system reset voltage and less than a minimum operating voltage of the at least one memory.

Step S120: configuring a first logic circuit to receive the control signal and a first clock signal provided by the at least one memory controller, and to output the first memory clock signal to the at least one memory according to the control signal, in which, according to the control signal, the first logic circuit outputs a clock stop signal to the at least one memory when the supply voltage is less than the first threshold value.

It should be noted that, in the system 1 of FIG. 5, the above-mentioned first logic circuit is coupled to a first memory controller and receives the first clock signal provided by the first memory controller, and is coupled to a first memory and outputs the first memory clock signal to the first memory. In addition, the method of the present disclosure can further include the following step: configuring a second logic circuit to receive the control signal and a second clock signal provided by a second memory controller, and to output a second memory clock signal of the second clock signal or of the logic low level to the second memory according to the control signal. Relevant details of the method are similar to those mentioned above, and thus will not be reiterated herein.

Beneficial Effects of the Embodiments

In conclusion, in the memory clock control circuit and the method for controlling the memory clock provided by the present disclosure, the control signal can be output in a blind zone through the voltage detection circuit, and according to the control signal, a memory clock signal of the logic low level can be output through a logic circuit for stopping operation of the memory. In this way, incidences of the memory executing unexpected read/write commands in the blind zone are significantly decreased.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A memory clock control circuit, which is coupled between at least one memory controller and at least one memory, the memory clock control circuit comprising:
    a voltage detection circuit, wherein the voltage detection circuit receives a supply voltage of the at least one memory, and outputs a control signal according to a comparison result of the supply voltage and at least one threshold value; wherein the at least one threshold value includes a first threshold value, and the first threshold value is greater than a system reset voltage and less than a minimum operating voltage of the at least one memory; and
    a first logic circuit coupled to the voltage detection circuit, the at least one memory controller, and the at least one memory, wherein the first logic circuit receives the control signal and a first clock signal provided by the at least one memory controller, and outputs a first memory clock signal to the at least one memory according to the control signal; wherein, according to the control signal, the first logic circuit outputs a clock stop signal to the at least one memory when the supply voltage is less than the first threshold value.

2. The memory clock control circuit according to claim 1, wherein, in response to the control signal being at a logic high level, the first logic circuit outputs the first memory clock signal of the first clock signal; wherein, in response to the control signal being at a logic low level, the first logic circuit outputs the first memory clock signal of the logic low level as the clock stop signal.

3. The memory clock control circuit according to claim 2, wherein, when the supply voltage is less than the first threshold value, the voltage detection circuit outputs the control signal of the logic low level.

4. The memory clock control circuit according to claim 3, wherein the at least one threshold value further includes a second threshold value, and the second threshold value is greater than the first threshold value and less than the minimum operating voltage of the at least one memory; wherein, after outputting the control signal of the logic low level, the voltage detection circuit outputs the control signal of the logic high level when the supply voltage is greater than the second threshold value.

5. The memory clock control circuit according to claim 4, wherein the at least one memory controller includes a first memory controller and a second memory controller, and the first logic circuit is coupled to the first memory controller and receives the first clock signal provided by the first memory controller.

6. The memory clock control circuit according to claim 5, wherein the at least one memory includes a first memory and a second memory, and the first logic circuit is coupled to the first memory and outputs the first memory clock signal to the first memory.

7. The memory clock control circuit according to claim 6, further comprising:

a second logic circuit coupled to the voltage detection circuit, the second memory controller, and the second memory, wherein the second logic circuit receives the control signal and a second clock signal provided by the second memory controller, and outputs a second memory clock signal of the second clock signal or of the logic low level to the second memory according to the control signal.

8. A method for controlling a memory clock, which is applied to a system that includes at least one memory controller and at least one memory, the method comprising:
configuring a voltage detection circuit to receive a supply voltage of the at least one memory, and to output a control signal according to a comparison result of the supply voltage and at least one threshold value; wherein the at least one threshold value includes a first threshold value, and the first threshold value is greater than a system reset voltage and less than a minimum operating voltage of the at least one memory; and
configuring a first logic circuit to receive the control signal and a first clock signal provided by the at least one memory controller, and to output a first memory clock signal to the at least one memory according to the control signal; wherein, according to the control signal, the first logic circuit outputs a clock stop signal to the at least one memory when the supply voltage is less than the first threshold value.

9. The method according to claim 8, wherein, in response to the control signal being at a logic high level, the first logic circuit outputs the first memory clock signal of the first clock signal; wherein, in response to the control signal being at a logic low level, the first logic circuit outputs the first memory clock signal of the logic low level as the clock stop signal.

10. The method according to claim 9, wherein, when the supply voltage is less than the first threshold value, the voltage detection circuit outputs the control signal of the logic low level.

11. The method according to claim 10, wherein the at least one threshold value further includes a second threshold value, and the second threshold value is greater than the first threshold value and less than the minimum operating voltage of the at least one memory; wherein, after outputting the control signal of the logic low level, the voltage detection circuit outputs the control signal of the logic high level when the supply voltage is greater than the second threshold value.

12. The method according to claim 11, wherein the at least one memory controller includes a first memory controller and a second memory controller, and the first logic circuit is coupled to the first memory controller and receives the first clock signal provided by the first memory controller.

13. The method according to claim 12, wherein the at least one memory includes a first memory and a second memory, and the first logic circuit is coupled to the first memory and outputs the first memory clock signal to the first memory.

14. The method according to claim 13, further comprising:
configuring a second logic circuit to receive the control signal and a second clock signal provided by the second memory controller, and to output a second memory clock signal of the second clock signal or of the logic low level to the second memory according to the control signal.

* * * * *